United States Patent
Yoshizaki et al.

(10) Patent No.: US 11,518,911 B2
(45) Date of Patent: Dec. 6, 2022

(54) POLISHING COMPOSITION, MANUFACTURING METHOD OF POLISHING COMPOSITION, POLISHING METHOD, AND MANUFACTURING METHOD OF SEMICONDUCTOR SUBSTRATE

(71) Applicant: FUJIMI INCORPORATED, Aichi (JP)

(72) Inventors: Yukinobu Yoshizaki, Aichi (JP); Yohei Takahashi, Aichi (JP); Yohei Nakata, Aichi (JP)

(73) Assignee: FUJIMI INCORPORATED

( * ) Notice: Subject to any disclaimer, the term of this patent is extended or adjusted under 35 U.S.C. 154(b) by 0 days.

(21) Appl. No.: 16/982,940

(22) PCT Filed: Feb. 28, 2019

(86) PCT No.: PCT/JP2019/007850
§ 371 (c)(1),
(2) Date: Sep. 21, 2020

(87) PCT Pub. No.: WO2019/181419
PCT Pub. Date: Sep. 26, 2019

(65) Prior Publication Data
US 2021/0024780 A1 Jan. 28, 2021

(30) Foreign Application Priority Data
Mar. 23, 2018 (JP) .............................. JP2018-055682

(51) Int. Cl.
| | | |
|---|---|---|
| C09G 1/02 | (2006.01) | |
| B24B 37/04 | (2012.01) | |
| C09K 3/14 | (2006.01) | |
| B24B 37/00 | (2012.01) | |
| H01L 21/306 | (2006.01) | |
| H01L 21/3105 | (2006.01) | |
| H01L 21/321 | (2006.01) | |
| H01L 21/768 | (2006.01) | |

(52) U.S. Cl.
CPC .............. C09G 1/02 (2013.01); B24B 37/00 (2013.01); B24B 37/044 (2013.01); C09K 3/1409 (2013.01); C09K 3/1436 (2013.01); C09K 3/1454 (2013.01); C09K 3/1463 (2013.01); H01L 21/30625 (2013.01); H01L 21/31053 (2013.01); H01L 21/3212 (2013.01); H01L 21/7684 (2013.01); H01L 21/76819 (2013.01)

(58) Field of Classification Search
None
See application file for complete search history.

(56) References Cited

U.S. PATENT DOCUMENTS

| | | | | |
|---|---|---|---|---|
| 2008/0125017 A1* | 5/2008 | Shimizu | ............ | H01L 21/31053 451/36 |
| 2013/0146804 A1* | 6/2013 | Mizuno | .................... | C09G 1/02 252/79.1 |
| 2014/0302752 A1* | 10/2014 | Tsuchiya | ............... | H01L 21/304 451/41 |
| 2014/0349484 A1* | 11/2014 | Yokota | .................... | C09G 1/02 438/693 |
| 2014/0370696 A1* | 12/2014 | Tu | ..................... | H01L 29/66545 438/585 |
| 2018/0057711 A1 | 3/2018 | Onishi et al. | | |
| 2019/0112505 A1* | 4/2019 | Yoshizaki | ............ | C09K 3/1436 |

FOREIGN PATENT DOCUMENTS

| | | |
|---|---|---|
| CN | 101186711 A | 11/2007 |
| CN | 104025265 A | 9/2013 |
| CN | 107533967 A | 1/2018 |
| JP | 2004051756 A | 2/2004 |
| JP | 2008130988 A | 6/2008 |
| JP | 2010144111 A | 7/2010 |
| JP | 2016025156 A | 2/2016 |
| JP | 2017057398 A | 3/2017 |
| JP | 201885513 A | 5/2018 |
| TW | 200902693 A | 1/2009 |
| TW | 201341515 A | 10/2013 |
| WO | 2017169808 A | 10/2017 |
| WO | WO2017169808 | * 10/2017 ........... H01L 21/304 |

OTHER PUBLICATIONS

International Search Report and Written Opinion of PCT/JP2019/007850 dated Apr. 9, 2019.
First Office Action of CN 201980021268.4 dated Apr. 27, 2021.
Notice of Reasons for Refusal for JP Patent Appl. 2018-055682, dated Sep. 14, 2021.
Second Office Action for CN Patent Appl. 201980021268.4, dated Dec. 28, 2021.
Notice of Reasons for Refusal for JP Patent Appl. 2018-055682.
Office Action for TW Application No. 108108624, dated Jul. 27, 2022.

* cited by examiner

Primary Examiner — Jiong-Ping Lu
(74) Attorney, Agent, or Firm — Katten Munchin Roseman LLP

(57) ABSTRACT

The present invention provides, in polishing an object to be polished that contains an (a) material having silicon-nitrogen bonding and (b) other materials, means that is capable of improving a ratio of a polishing speed of the (a) material to a polishing speed of the (b) materials.
The present invention relates to a polishing composition used for polishing an object to be polished that contains an (a) material having silicon-nitrogen bonding and (b) other materials, the polishing composition containing: organic acid-immobilized silica; a dispersing medium; a selection ratio improver that improves a ratio of a polishing speed of the (a) material to a polishing speed of the (b) materials; and an acid, in which the selection ratio improver is organopolysiloxane having a hydrophilic group.

13 Claims, No Drawings

POLISHING COMPOSITION, MANUFACTURING METHOD OF POLISHING COMPOSITION, POLISHING METHOD, AND MANUFACTURING METHOD OF SEMICONDUCTOR SUBSTRATE

CROSS-REFERENCE TO RELATED APPLICATIONS

This application is a U.S. National Stage entry of International Application No. PCT/JP2019/007850 filed Feb. 28, 2019, which claims the benefit of JP Patent Application 2018-055682 filed Mar. 23, 2018, each of which is herein incorporated by reference in its entirety for all purposes.

TECHNICAL FIELD

The present invention relates to a polishing composition, a manufacturing method of a polishing composition, a polishing method, and a manufacturing method of a semiconductor substrate.

BACKGROUND ART

Recently, a new microfabrication technology has been developed along with high integration and high performance of LSI (Large Scale Integration). A chemical mechanical polishing (CMP) method is also one of the technologies, and is a technology that is frequently used in an LSI manufacturing step, in particular, in the flattening of an interlayer insulating film, the formation of a metal plug, and the formation of embedded wiring (damascene wiring), in a multi-layer wiring forming step.

The CMP has been applied to each step in the manufacturing of a semiconductor, and examples of one aspect thereof include the application to a gate forming step in the preparation of a transistor. When the transistor is prepared, a material such as a metal, silicon, silicon oxide, polycrystalline silicon (polysilicon), and a silicon nitride (silicon nitride) may be polished, and a polishing speed (a polishing rate) of each material is required to be controlled in accordance with the structure of the transistor.

As a technology of controlling the polishing speed, for example, in JP 2008-130988 A (corresponding to the specification of US 2008/0,125,017 A), a polishing composition containing abrasive grains selected from silica and ceria, an alkali selected from ammonia, an ammonium salt, an alkali metal salt, and an alkali metal hydroxide, and organic modified silicone oil selected from polyoxyethylene-modified silicone oil, poly(oxyethylene oxypropylene)-modified silicone oil, epoxy/polyether-modified silicone oil, and amino/polyether-modified silicone oil is disclosed. According to such a polishing composition, selective polish of a silicon oxide film with respect to a polysilicon film can be performed.

SUMMARY OF INVENTION

In the demand for controlling the polishing speed of each of the materials, there is also a demand for selectively polishing a material having silicon-nitrogen bonding, such as a silicon nitride film.

However, in JP 2008-130988 A (corresponding to the specification of US 2008/0,125,017 A), a technology of selectively polishing the material having silicon-nitrogen bonding, such as a silicon nitride film, is not disclosed, and it has not been possible to exhibit high selectivity of a polishing speed of the material having silicon-nitrogen bonding, such as a silicon nitride film.

Accordingly, an object of the present invention is to provide, in polishing an object to be polished that contains an (a) material having silicon-nitrogen bonding and (b) other materials, means that is capable of improving a ratio of a polishing speed of the (a) material to a polishing speed of the (b) materials.

In order to attain the object described above, the present inventors have conducted intensive studies. As a result thereof, it has been found that the object is attained by a polishing composition used for polishing an object to be polished that contains an (a) material having silicon-nitrogen bonding and (b) other materials, the polishing composition containing: organic acid-immobilized silica; a dispersing medium; a selection ratio improver that improves a ratio of a polishing speed of the (a) material to a polishing speed of the (b) materials; and an acid, in which the selection ratio improver is organopolysiloxane having a hydrophilic group, and the present invention has been completed.

DESCRIPTION OF EMBODIMENTS

The present invention relates to a polishing composition used for polishing an object to be polished that contains an (a) material having silicon-nitrogen bonding and (b) other materials, the polishing composition containing: organic acid-immobilized silica; a dispersing medium; a selection ratio improver that improves a ratio of a polishing speed of the (a) material to a polishing speed of the (b) materials; and an acid, in which the selection ratio improver is organopolysiloxane having a hydrophilic group. The polishing composition of the present invention having such a configuration is capable of improving the ratio of the polishing speed of the (a) material having silicon-nitrogen bonding to the polishing speed of the (b) other materials in polishing the object to be polished that contains the (a) material having silicon-nitrogen bonding and the (b) other materials.

Hereinafter, an embodiment of the present invention will be described. Note that, the present invention is not limited only to the following embodiment.

Herein, unless stated otherwise, an operation and the measurement of physical properties or the like are performed in a condition of room temperature (20° C. to 25° C.)/relative humidity of 40% RH to 50% RH.

[Object to be Polished]

An object to be polished according to the present invention contains an (a) material having silicon-nitrogen bonding and (b) other materials.

Examples of the (a) material having silicon-nitrogen bonding (hereinafter, also simply referred to as an "(a) material") include a silicon nitride film, a SiCN (silicon carbo-nitride) film, and the like.

The (b) other materials (hereinafter, also simply referred to as "(b) materials") are not particularly limited insofar as the materials are other than the material having silicon-nitrogen bonding, and examples thereof include, for example, a silicon-containing material (other than the material having silicon-nitrogen bonding), various insulating materials, various metal materials, and the like.

According to a preferred embodiment of the present invention, the (b) other materials are at least one type selected from the group consisting of a metal material such as tungsten, copper, tantalum, titanium, cobalt, ruthenium, hafnium, or aluminum; an alloy material obtained by combining the metal material with nitrogen, oxygen, silicon, carbon, or phosphorus; a material having silicon-silicon bonding; a low-permittivity material (a Low-k material); and an insulating material. According to such an object to be polished, it is possible to more effectively exhibit high selectivity of a polishing speed.

Here, examples of the material having silicon-silicon bonding include polysilicon, amorphous silicon, single-crystalline silicon, n-type doped single-crystalline silicon, p-type doped single-crystalline silicon, and the like.

The low-permittivity material (the Low-k material) is a material having a relative permittivity k lower than that of silicon oxide (k=4.0), and is preferably a material having a relative permittivity k of less than or equal to 3.0, and specifically, the low-permittivity material is at least one type selected from the group consisting of SiOC, silicon oxide having a methyl group, benzocyclobutene (BCB), fluorinated silicon oxide (SiOF), HSQ (hydrogen silsesquioxane), MSQ (methyl silsesquioxane), HMSQ (hydride-methyl silsesquioxane), a polyimide-based polymer, an allylene ether-based polymer, a cyclobutene-based polymer, and perfluorocyclobutene (PFOB).

The insulating material is a material having a volume resistivity of greater than or equal to $1 \times 10^{10}$ Ω·cm, and indicates a material other than the above. Specifically, examples of the insulating material are capable of including an organic material such as an acrylic resin, a phenol resin, a fluorine resin, an epoxy resin, a cardo-based resin, a vinyl resin, an imide resin, a novolac resin, and polyparaxylene, and an inorganic material such as silicon oxide (for example, a TEOS (Tetraethyl Orthosilicate) type silicon oxide film (hereinafter, also simply referred to as a "TEOS film") that is generated by using tetraethyl orthosilicate as a precursor, a HDP (High Density Plasma) film, a USG (Undoped Silicate Glass) film, a PSG (Phosphorus Silicate Glass) film, a BPSG (Boron-Phospho Silicate Glass) film, an RTO (Rapid Thermal Oxidation) film, and the like) and $Al_2O_3$.

[Abrasive Grains: Organic Acid-Immobilized Silica]

In the present invention, organic acid-immobilized silica that functions as abrasive grains of a polishing composition is obtained by immobilizing an organic acid to silica (herein, the "organic acid-immobilized silica" may be simply referred to as "abrasive grains"). It is preferable to use colloidal silica as silica, from the viewpoint of suppressing the occurrence of a polishing flaw.

The colloidal silica, for example, can be colloidal silica manufactured by a sol-gel method. The colloidal silica manufactured by the sol-gel method is preferable since the content of metal impurities or corrosive ions such as chloride ions, having diffusivity in a semiconductor, is small. The manufacturing of the colloidal silica by the sol-gel method can be performed by using a known method of the related art, and specifically, colloidal silica can be obtained by using a hydrolyzable silicon compound (for example, alkoxy silane or a derivative thereof) as a raw material, and by performing a hydrolysis condensation reaction.

However, the immobilization of an organic acid is not capable of being attained by simply allowing silica and an organic acid to coexist. In a case where a sulfonic acid that is one type of organic acid is immobilized to silica, for example, it is possible to perform the immobilization by a method described in "Sulfonic acid-functionalized silica through of thiol groups", Chem. Commun. 246-247 (2003). Specifically, a silane coupling agent having a thiol group, such as 3-mercaptopropyl trimethoxy silane, is coupled to silica, and then, a thiol group is oxidized by hydrogenperoxide, and thus, it is possible to obtain silica in which a sulfonic acid is immobilized to the surface. Colloidal silica used in Examples is also modified with a sulfonic acid group, as described above.

Alternatively, in a case where a carboxylic acid that is one type of organic acid is immobilized to silica, for example, it is possible to perform the immobilization by a method described in "Novel Silane Coupling Agents Containing a Photolabile 2-Nitrobenzyl Ester for Introduction of a Carboxy Group on the Surface of Silica Gel", Chemistry Letters, 3, 228-229 (2000). Specifically, a silane coupling agent containing photoreactive 2-nitrobenzyl ester is coupled to silica, and then, light irradiation is performed, and thus, it is possible to obtain silica in which a carboxylic acid is immobilized to the surface.

According to a preferred embodiment of the present invention, the organic acid-immobilized silica is sulfonic acid-immobilized silica. According to such an embodiment, it is possible to obtain an effect that the dispersibility of the abrasive grains (the sulfonic acid-immobilized silica) in the polishing composition is more excellent.

A lower limit of an average primary particle size of the abrasive grains in the polishing composition of the present invention is preferably greater than or equal to 5 nm, is more preferably greater than or equal to 7 nm, and is even more preferably greater than or equal to 10 nm. In addition, an upper limit of the average primary particle size of the abrasive grains in the polishing composition of the present invention is preferably less than or equal to 60 nm, is more preferably less than or equal to 40 nm, and is even more preferably less than or equal to 25 nm. According to such a range, it is possible to suppress the occurrence of a defect such as a scratch on the surface of the object to be polished after being polished by using the polishing composition. Note that, the average primary particle size of the abrasive grains, for example, is calculated on the basis of a specific surface area of the abrasive grains that is measured by a BET method.

A lower limit of an average secondary particle size of the abrasive grains in the polishing composition of the present invention is preferably greater than or equal to 5 nm, is more preferably greater than or equal to 10 nm, and is even more preferably greater than or equal to 15 nm. In addition, an upper limit of the average secondary particle size of the abrasive grains is preferably less than or equal to 250 nm, is more preferably less than or equal to 170 nm, is even more preferably less than or equal to 120 nm, and is particularly preferably less than or equal to 80 nm. According to such a range, it is possible to further suppress the occurrence of a surface defect on the surface of the object to be polished after being polished by using the polishing composition. Note that, here, secondary particles indicate particles formed by the association of the abrasive grains in the polishing composition, and an average secondary particle size of the secondary particles, for example, can be measured by a dynamic light scattering method represented by a laser diffraction scattering method.

In a grain size distribution of the abrasive grains in the polishing composition of the present invention, which is obtained by a laser diffraction scattering method, a lower limit of a ratio of a diameter D90 of the particles when an integrated particle mass reaches 90% of a total particle mass from a fine particle side to a diameter D10 of the particles when the integrated particle mass reaches 10% of the total particle mass (herein, also simply referred to as "D90/D10") is preferably greater than or equal to 1.3, is more preferably greater than or equal to 1.4, and is even more preferably greater than or equal to 1.5. In addition, an upper limit of D90/D10 is not particularly limited, but is preferably less than or equal to 5.0, is more preferably less than or equal to 4.0, and is even more preferably less than or equal to 3.0. According to such a range, it is possible to suppress the occurrence of a surface defect on the surface of the object to be polished after being polished by using the polishing composition.

An average degree of association of the abrasive grains is preferably less than or equal to 5.0, is more preferably less than or equal to 4.0, and is even more preferably less than or equal to 3.0. A defect can be further reduced as the average degree of association of the abrasive grains decreases. In addition, the average degree of association of the abrasive grains is preferably greater than or equal to 1.0, and is more preferably greater than or equal to 1.1. The average degree of association is obtained by dividing the value of the average secondary particle size of the abrasive grains by the value of the average primary particle size. There is an advantageous effect that the polishing speed of the object to be polished by the polishing composition is improved as the average degree of association of the abrasive grains increases.

An upper limit of an aspect ratio of the abrasive grains is not particularly limited, but is preferably less than 2.0, is more preferably less than or equal to 1.8, and is even more preferably less than or equal to 1.5. According to such a range, it is possible to further reduce a defect on the surface of the object to be polished. Note that, the aspect ratio is an average of values obtained by taking the smallest rectangle circumscribing an image of the abrasive grains with a scanning electron microscope, and by dividing the length of a long side of the rectangle by the length of a short side of the same rectangle, and can be obtained by using general image analysis software. A lower limit of the aspect ratio of the abrasive grains in the polishing composition is not particularly limited, but is preferably greater than or equal to 1.0.

The size of the abrasive grains (the average primary particle size, the average secondary particle size, the aspect ratio, D90/D10, and the like) can be suitably controlled by selecting a manufacturing method of the abrasive grains, or the like.

A lower limit of the content of the abrasive grains in the polishing composition of the present invention is preferably greater than or equal to 0.01 mass %, is more preferably greater than or equal to 0.05 mass %, and is even more preferably greater than or equal to 0.1 mass %. In addition, an upper limit of the content of the abrasive grains in the polishing composition of the present invention is preferably less than or equal to 20 mass %, is more preferably less than or equal to 10 mass %, is even more preferably less than or equal to 5 mass %, is still even more preferably less than or equal to 3 mass %, and is most preferably less than or equal to 2 mass %. In a case where the upper limit of the content is in such a range, it is possible to suppress the cost of the polishing composition, and to further suppress the occurrence of a surface defect on the surface of the object to be polished after being polished by using the polishing composition.

[Dispersing Medium]

The polishing composition of the present invention contains a dispersing medium for dispersing each of the components. Water; alcohols such as methanol, ethanol, and ethylene glycol; ketones such as acetone and the like, or a mixture thereof, and the like can be exemplified as the dispersing medium. Among them, water is preferable as the dispersing medium. That is, according to a preferred mode of the present invention, the dispersing medium contains water. According to more preferred mode of the present invention, the dispersing medium substantially contains water. Note that, "substantially" described above indicates that a dispersing medium other than water can be contained within a range in which the object and the effect of the present invention can be attained, and more specifically, indicates that the dispersing medium preferably contains water of greater than or equal to 90 mass % and less than or equal to 100 mass % and the dispersing medium other than water of greater than or equal to 0 mass % and less than or equal to 10 mass %, and more preferably contains water of greater than or equal to 99 mass % and less than or equal to 100 mass % and the dispersing medium other than water of greater than or equal to 0 mass % and less than or equal to 1 mass %. Most preferably, the dispersing medium is water.

Water containing minimum impurities is preferable as the dispersing medium, and specifically, pure water, ultrapure water, in which impurities ions are removed by an ion exchange resin, and then foreign substances are removed through a filter, or distilled water are more preferable from the viewpoint of not inhibiting the action of the component contained in the polishing composition.

[Selection Ratio Improver]

In the present invention, the polishing composition is made to contain a selection ratio improver, and thus, it is possible to improve the ratio (a selection ratio) of the polishing speed of the (a) material to the polishing speed of the (b) materials.

In the present invention, the selection ratio improver is organopolysiloxane having a hydrophilic group. Organopolysiloxane having a hydrophilic group is easily adsorbed on the surface of the (b) materials, and thus, suppresses the polishing speed of the (b) materials, and as a result thereof, the selection ratio of the polishing speed of the (a) material is improved. The selection ratio improvers (organopolysiloxane having a hydrophilic group) can be independently used, or two or more types thereof can be used by being mixed.

Organopolysiloxane having a hydrophilic group is preferably hydrophilic group-modified silicone oil. Examples of the hydrophilic group include an amino group, an epoxy group, a carboxyl group, a carbinol group, an acryloyl group, a methacryloyl group, a mercapto group, a phenol group, a polyoxyalkylene group (for example, a polyoxyethylene group, a polyoxypropylene oxide group, and the like), and the like.

In addition, organopolysiloxane can be sorted into double-terminal type organopolysiloxane, single-terminal type organopolysiloxane, side-chain type organopolysiloxane, and side-chain double-terminal type organopolysiloxane, in accordance with a modified position of a hydrophilic group.

Double-terminal type polyoxyalkylene-modified silicone oil, single-terminal type polyoxyalkylene-modified silicone oil, side-chain type polyoxyalkylene-modified silicone oil, or side-chain double-terminal type polyoxyalkylene-modified silicone oil is preferable, from the viewpoint of more efficiently obtaining a desired effect of the present invention. That is, it is preferable that the hydrophilic group described above is a polyoxyalkylene group. Side-chain type polyoxyalkylene-modified silicone oil is more preferably.

In a preferred embodiment, a synthetic product may be used, or a commercially available product may be used, as polyoxyalkylene-modified silicone oil.

Examples of a commercially available product of double-terminal type polyoxyalkylene-modified silicone oil include X-22-4952, X-22-4272, and X-22-6266 (all are manufactured by Shin-Etsu Chemical Co., Ltd.); FZ-2203, FZ-2207, FZ-2208, and FZ-2154 (all are manufactured by Dow Corning Toray Silicone Co., Ltd.), Silsoft (Registered Trademark) 870 (manufactured by Momentive Performance Materials Japan LLC); and the like.

Examples of a commercially available product of single-terminal type polyoxyalkylene-modified silicone oil include FZ-2122 and FZ-720 (all are manufactured by Dow Corning Toray Silicone Co., Ltd.), and the like.

Examples of a commercially available product of side-chain type polyoxyalkylene-modified silicone oil include DBE-224, DBE-621, DBE-712, DBE-814, DBE-821, DBP-732, DBP-534, YAD-122, YBD-125, and YMS-T31 (all are manufactured by Gelest, Inc.); KF-351A, KF-352A, KF-353, KF-354L, KF-355A, KF-615A, KF-945, KF-640, KF-642, KF-643, KF-6020, X-22-6191, X-22-4515, KF-6011, KF-6012, KF-6015, KF-6017, and X-22-2516 (all are manufactured by Shin-Etsu Chemical Co., Ltd.); FZ-2110, FZ-2166, FZ-2164, FZ-2191, FZ-7001, FZ-2120, FZ-2130, FZ-2101, FZ-7002, FZ-2123, FZ-2104, FZ-2105, FZ-2118, FZ-2161, FZ-2162, SF8428, SH3771, BY16-036, and BY16-027 (all are manufactured by Dow Corning Toray Silicone Co., Ltd.); TSF4440, TSF4441, TSF4445, TSF4446, TSF4450, TSF4452, TSF4453, TSF4460, SF1188A, Silsoft (Registered Trademark) 305, Silsoft (Registered Trademark) 430, Silsoft (Registered Trademark) 440, Silsoft (Registered Trademark) 475, Silsoft (Registered Trademark) 805, Silsoft (Registered Trademark) 810, Silsoft (Registered Trademark) 840, Silsoft (Registered Trademark) 875, Silsoft (Registered Trademark) 876, Silsoft (Registered Trademark) 880, and Silsoft (Registered Trademark) 895 (all are manufactured by Momentive Performance Materials Japan LLC); and the like.

Polyoxyalkylene-modified silicone oil, for example, can be easily synthesized by a method described in JP 2002-179797 A, JP 2008-1896 A, JP 2008-1897 A, and the like, or a method based thereon.

A lower limit of a weight average molecular weight of the selection ratio improver (polyorganosiloxane having a hydrophilic group) is preferably greater than or equal to 200, is more preferably greater than or equal to 400, and is even more preferably greater than or equal to 600. In addition, an upper limit of the weight average molecular weight is preferably less than or equal to 100,000, is more preferably less than or equal to 20,000, and is even more preferably less than or equal to 15,000. That is, the weight average molecular weight of the selection ratio improver is preferably greater than or equal to 200 and less than or equal to 100,000, is more preferably greater than or equal to 400 and less than or equal to 20,000, and is even more preferably greater than or equal to 600 and less than or equal to 15,000. According to such a range, the selection ratio improver is easily dissolved in the dispersing medium, and an effect of improving the selection ratio is easily obtained. In addition, the stability of the polishing composition is also improved.

Note that, the weight average molecular weight of the selection ratio improver can be measured by a gel permeation chromatography (GPC), and specifically, can be measured by the following apparatuses and the following conditions.

GPC Apparatus: Manufactured by SHIMADZU CORPORATION Model: Prominence+ELSD Detector (ELSD-LTII)
Column: VP-ODS (Manufactured by SHIMADZU CORPORATION) Mobile Phase A: MeOH
Mobile Phase B: 1% of Aqueous Solution of Acetic Acid
Flow Rate: 1 mL/minute
Detector: ELSD temp. 40° C., Gain 8, $N_2$ GAS 350 kPa
Oven Temperature: 40° C.
Injection Amount: 40 µL.

A lower limit of the content of the selection ratio improver in the polishing composition is not particularly limited, but is preferably greater than or equal to 0.0001 mass % (0.001 g/L), is more preferably greater than or equal to 0.001 mass % (0.01 g/L), and is more preferably greater than or equal to 0.005 mass % (0.05 g/L). In a case where the lower limit of the content is in such a range, an effect of improving the selection ratio of the polishing speed can be efficiently obtained.

In addition, an upper limit of the content of the selection ratio improver in the polishing composition is preferably less than or equal to 1 mass % (10 g/L), is more preferably less than or equal to 0.5 mass % (5 g/L), is even more preferably less than or equal to 0.05 mass % (0.5 g/L), and is particularly preferably less than or equal to 0.03 mass % (0.3 g/L). In a case where the upper limit of the content is in such a range, it is possible to suppress the aggregation of the organic acid-immobilized silica that is the abrasive grains.

Accordingly, the range of the content of the selection ratio improver is preferably greater than or equal to 0.0001 mass % (0.001 g/L) and less than or equal to 1 mass % (10 g/L), is more preferably greater than or equal to 0.001 mass % (0.01 g/L) and less than or equal to 0.5 mass % (5 g/L), is even more preferably greater than or equal to 0.005 mass % (0.05 g/L) and less than or equal to 0.05 mass % (0.5 g/L), and is particularly preferably greater than or equal to 0.005 mass % (0.05 g/L) and less than or equal to 0.03 mass % (0.3 g/L).

[Acid]

The polishing composition of the present invention contains an acid. By containing an acid, an effect of further improving the polishing speed of the (a) material such as silicon nitride can be obtained.

Specific examples of the acid may be any one of an inorganic compound and an organic compound, and examples of the acid include an inorganic acid such as a hydrochloric acid, a sulfuric acid, a nitric acid, a boric acid, a carbonic acid, a hypophosphorous acid, a phosphorus acid, and a phosphoric acid; an organic acid such as a carboxylic acid such as a citric acid, a formic acid, an acetic acid, a propionic acid, a benzoic acid, a hydroxyacetic acid, a salicylic acid, a glyceric acid, an oxalic acid, a malonic acid, a succinic acid, a maleic acid, a phthalic acid, a malic acid, a tartaric acid, a hydroxyisobutyric acid, and a lactic acid, and an organic sulfuric acid such as a methane sulfonic acid, an ethane sulfonic acid, and an isethionic acid, and the like. Such acids can be independently used, or two or more types thereof can be used by being mixed. In a case where an inorganic acid is used as the pH adjusting agent, a sulfuric acid, a nitric acid, a phosphorus acid, a phosphoric acid, and the like are more preferable. In addition, in a case where an organic acid is used as the pH adjusting agent, an acetic acid, a lactic acid, a benzoic acid, a hydroxyacetic acid, a maleic acid, a citric acid, a tartaric acid, and a hydroxyisobutyric acid are preferable, and a maleic acid, a citric acid, and a tartaric acid are more preferable.

The content of an acid in the polishing composition is not particularly limited, and may be suitably adjusted such that the polishing composition has desired pH.

[pH Adjusting Agent]

The polishing composition of the present invention can be adjusted to any of an acidic region, a neutral region, and a basic region, and it is preferable to adjust the polishing composition to the acidic region, from the viewpoint of improving the polishing speed of the (a) material such as silicon nitride.

In the present invention, the acidic region indicates that pH is less than 7.0, and the pH is preferably less than or equal to 6, is more preferably less than or equal to 4, and is even more preferably less than or equal to 3. In addition, the pH is preferably greater than or equal to 1, is more preferably greater than or equal to 1.2, and is even more preferably greater than or equal to 2. According to such a range, it is possible to more effectively exhibit high selectivity of the polishing speed. In addition, the neutral region indicates that pH is 7.0. Further, the basic region indicates that pH is greater than 7.0, and the pH is preferably greater than or equal to 8 and less than or equal to 13. Note that, the value of the pH in the present invention is a value measured by a method described in Examples.

Specific examples of a pH adjusting agent for adjusting the polishing composition to the acidic region include the acids described above. In addition, in a case where a divalent or higher acid (for example, a sulfuric acid, a carbonic acid, a phosphoric acid, an oxalic acid, and the like) in the acids described above is capable of discharging one or more protons ($H^+$), a salt thereof may be used as the pH adjusting agent. Specifically, for example, ammonium hydrogen carbonate, hydrogen ammonium phosphate, and the like are exemplified (a counter cation may be basically any type, but a weakly basic cation (ammonium, triethanol amine, and the like) is preferable).

Specific examples of a pH adjusting agent for adjusting the polishing composition to the basic region may be any one of an inorganic compound and an organic compound, and examples of the pH adjusting agent include an alkali metal hydroxide or a salt thereof, quaternary ammonium, quaternary ammonium hydroxide or a salt thereof, ammonia, amine, and the like.

Specific examples of an alkali metal include potassium, sodium, and the like. Specific examples of a salt include a carbonate, a hydrogen carbonate, a sulfate, an acetate, and the like.

Specific examples of quaternary ammonium include tetramethyl ammonium, tetraethyl ammonium, tetrabutyl ammonium, and the like.

Specific examples of quaternary ammonium hydroxide or a salt thereof include tetramethyl ammonium hydroxide, tetraethyl ammonium hydroxide, tetrabutyl ammonium hydroxide, and the like.

An addition amount of the pH adjusting agent is not particularly limited, and may be suitably adjusted such that the polishing composition has desired pH.

[Other Components]

The polishing composition of the present invention may further contain a known additive that can be used in the polishing composition, such as an oxidizing agent, a complexing agent, an antiseptic agent, and an antifungal agent, as necessary, within a range in which the effects of the present invention are not significantly hindered.

[Manufacturing Method of Polishing Composition]

A manufacturing method of the polishing composition of the present invention is not particularly limited, and for example, the polishing composition can be obtained by stirring and mixing organic acid-immobilized silica, a selection ratio improver, an acid, and as necessary, other additives in a dispersing medium (for example, water). Therefore, the present invention provides a manufacturing method of the polishing composition of the present invention, including mixing the organic acid-immobilized silica, the dispersing medium, the selection ratio improver, and the acid. The details of each component are as described above.

A temperature at the time of mixing each of the components is not particularly limited, but is preferably higher than or equal to 10° C. and lower than or equal to 40° C., and may be heated in order to increase a rate of dissolution. In addition, a mixing time is not also particularly limited insofar as mixing can be homogeneously performed.

[Polishing Method and Manufacturing Method of Semiconductor Substrate]

As described above, the polishing composition of the present invention can be preferably used for polishing the object to be polished that contains the (a) material having silicon-nitrogen bonding and the (b) other materials. Accordingly, the present invention provides a polishing method of polishing an object to be polished that contains an (a) material having silicon-nitrogen bonding and (b) other materials with the polishing composition of the present invention. In addition, the present invention provides a manufacturing method of a semiconductor substrate, including: a step of polishing a semiconductor substrate that contains an (a) material having silicon-nitrogen bonding and (b) other materials, by the polishing method.

A general polishing apparatus including a polishing table to which a holder for retaining a substrate including an object to be polished, and the like, a motor capable of changing the number of rotations, and the like are attached and a polishing pad (a polishing cloth) can be pasted can be used as a polishing apparatus.

A general non-woven fabric, polyurethane, a porous fluorine resin, and the like can be used as the polishing pad without any particular limitation. It is preferable that the polishing pad is subjected to groove processing such that a polishing liquid is accumulated.

As a polishing condition, for example, it is preferable that a rotation speed of the polishing table is greater than or equal to 10 rpm (0.17 $s^{-1}$) and less than or equal to 500 rpm (8.33 $s^{-1}$). It is preferable that a pressure (a polishing pressure) to be applied to the substrate including the object to be polished is greater than or equal to 0.5 psi (3.45 kPa) and less than or equal to 10 psi (69.0 kPa). A method of supplying the polishing composition to the polishing pad is not also particularly limited, and for example, a method of consecutively supplying the polishing composition with a pump or the like is adopted. There is no limitation in a supply amount, but it is preferable that the surface of the polishing pad is constantly covered with the polishing composition of the present invention.

The substrate is cleaned in flowing water after polishing is ended, and water droplets attached onto the substrate are brushed off and dried by a spin dryer or the like, and thus, a substrate including a layer containing a metal can be obtained.

The polishing composition of the present invention may be a one-component polishing composition, or may be a multi-component polishing composition such as a two-component polishing composition. In addition, the polishing composition of the present invention may be prepared by diluting an undiluted solution of the polishing composition with a diluent such as water, for example, by greater than or equal to 10 times.

(Selection Ratio)

According to the present invention, the selection ratio of the (a) material to the (b) materials is improved compared to a case where the selection ratio improver according to the present invention is not contained, as described in the section of Examples.

In a preferred embodiment of the present invention, in a case where the (b) materials have silicon-silicon bonding, the selection ratio is preferably greater than or equal to 10, is more preferably greater than or equal to 11, is even more preferably greater than or equal to 15, and is particularly preferably greater than or equal to 20.

Here, even in the case of using the same selection ratio improver, the value of the selection ratio of the (a) material can be changed in accordance with the type of (b) materials. For this reason, whether or not the selection ratio is improved by containing the selection ratio improver can be determined by comparing each type of (b) materials with a case where the selection ratio improver is not contained.

EXAMPLES

The present invention will be described in more detail by using Examples and Comparative Examples described below. However, the technical scope of the present invention is not limited only to Examples described below. Note that, unless stated otherwise, "%" and "parts" indicate "mass o" and "parts by mass", respectively.

A weight average molecular weight of a selection ratio improver was measured by the following apparatus and the following condition.

GPC Apparatus: Manufactured by SHIMADZU CORPORATION
Model: Prominence+ELSD detector (ELSD-LTII)
Column: VP-ODS (Manufactured by SHIMADZU CORPORATION)
Mobile Phase A: MeOH
Mobile Phase B: 1% of Aqueous Solution of Acetic Acid
Flow Rate: 1 mL/minute
Detector: ELSD temp. 40° C., Gain 8, $N_2$ GAS 350 kPa
Oven Temperature: 40° C.
Injection Amount: 40 µL.

A silicon wafer (200 mm, a blanket wafer) in which a TEOS film (a silicon oxide film) having a thickness of 10000 angstroms or a SiN film (a silicon nitride film) having a thickness of 3500 angstroms were formed on a surface was used as an object to be polished.

<Preparation of Polishing Composition>

Example 1

Abrasive grains (sulfonic acid-immobilized colloidal silica, Average Secondary Particle Size: 20 nm), DBE-712 (manufactured by Gelest, Inc., side-chain type polyoxyalkylene-modified silicone oil, Content of Ethylene Oxide: 70 mass %, Weight Average Molecular Weight: 600) as the selection ratio improver, and a maleic acid as an acid were stirred and mixed in a dispersing medium (pure water) such that the concentration of the abrasive grains was 1.5 mass % and such that pH was 1.5, and thus, a polishing composition was prepared (Mixing Temperature: approximately 25° C., Mixing Time: approximately 10 minutes).

Note that, the average secondary particle size of the abrasive grains was measured by a laser diffraction scattering method. In addition, the pH of the polishing composition (Liquid Temperature: 25° C.) was checked by a pH meter (manufactured by HORIBA, Ltd., Model Number: LAQUA).

Examples 2 to 11 and Comparative Examples 1 to 6

Polishing compositions were prepared as with Example 1, except that the pH, the type and the content of the abrasive grains, and the type and the content of the selection ratio improver were changed as shown in Table 1 described below.

The details of the used selection ratio improver are as follows;

DBE-814: Manufactured by Gelest, Inc., Side-Chain Type Polyoxyalkylene-Modified Silicone Oil, Content of Ethylene Oxide of 80 mass %, and Weight Average Molecular Weight of 1,000

DBP-732: Manufactured by Gelest, Inc., Side-Chain Type Polyoxyalkylene-Modified Silicone Oil, Content of Ethylene Oxide of 40 mass %, and Weight Average Molecular Weight of 20,000

TSF4440: Manufactured by Momentive Performance Materials Japan LLC, Side-Chain Type Polyoxyalkylene-Modified Silicone Oil, Content of Ethylene Oxide of 9 mass %, and Weight Average Molecular Weight of 8,000

Silsoft (Registered Trademark) 870: Manufactured by Momentive Performance Materials Japan LLC, Double-Terminal Type Polyoxyalkylene-Modified Silicone Oil, Content of Ethylene Oxide of 9 mass %, and Weight Average Molecular Weight of 10,000

Silsoft (Registered Trademark) 876: Manufactured by Momentive Performance Materials Japan LLC, Side-Chain Type Polyoxyalkylene-Modified Silicone Oil, Content of Ethylene Oxide of 12 mass %, and Weight Average Molecular Weight of 10,000

Silsoft (Registered Trademark) 895: Manufactured by Momentive Performance Materials Japan LLC, Side-Chain Type Polyoxyalkylene-Modified Silicone Oil, Content of Ethylene Oxide of 17 mass %, and Weight Average Molecular Weight of 12,000

PEG600: Manufactured by KANTO CHEMICAL CO., INC., Polyethylene Glycol, and Weight Average Molecular Weight of 600.

Note that, in Comparative Example 4, an acid was not used, and in Comparative Example 6, potassium hydroxide was used as a pH adjusting agent.

<Evaluation>

A polishing speed at the time of polishing each of the objects to be polished described above in the following polishing condition was measured by using each of the polishing compositions obtained as described above.

(Polishing Apparatus and Polishing Condition)

Polishing Apparatus: CMP One-Side Polishing Apparatus for 200 mm, Mirra

Polishing Pad: Manufactured by Nitta Haas Incorporated, Hard Polyurethane Pad IC1010

Polishing Pressure: 4.0 psi (1 psi=6894.76 Pa)
Number of Rotations of Polishing Table: 90 rpm
Number of Rotations of Head (Carrier): 100 rpm
Supply of Polishing Composition: Overflow
Supply Amount of Polishing Composition: 100 mL/min
Polishing Time: 60 sec.

(Polishing Speed)

The polishing speed (a polishing rate) was calculated by the following expression.

[Expression 1]

$$\text{Polishing Rate [Å/min]} = \frac{\text{Film Thickness [Å] Before Polishing} - \text{Film Thickness [Å] After Polishing}}{\text{Polishing Time [min]}}$$

The film thickness was obtained by a light interference type film thickness measurement apparatus (manufactured by KLA-Tencor Corporation, Model Number: ASET-f5x), and was evaluated by dividing a difference between the film thicknesses before and after polishing by the polishing time. Evaluation results are shown in Table 1 described below.

TABLE 1

| | Abrasive grains | | | Selection ratio improver (hydrophilic group-modified silicone oil) | |
| --- | --- | --- | --- | --- | --- |
| | Type | Average secondary particle size (nm) | Content (mass %) | Type | Structure |
| Example 1 | Sulfonic acid-immobilized colloidal silica | 20 | 1 | DBE-712 | Side-chain type |
| Example 2 | ↑ | 20 | 1 | DBE-712 | Side-chain type |
| Example 3 | ↑ | 20 | 1 | DBE-814 | Side-chain type |
| Example 4 | ↑ | 20 | 1 | DBE-814 | Side-chain type |
| Example 5 | ↑ | 20 | 1 | DSB-732 | Side-chain type |
| Example 6 | ↑ | 20 | 1 | TSF4440 | Side-chain type |
| Example 7 | ↑ | 20 | 1 | Silsoft 870 | Double-terminal type |
| Example 8 | ↑ | 20 | 1 | Silsoft 876 | Side-chain type |
| Example 9 | ↑ | 20 | 1 | Silsoft 895 | Side-chain type |
| Example 10 | ↑ | 20 | 3 | DBE-712 | Side-chain type |
| Example 11 | ↑ | 20 | 1 | Silsoft 895 | Side-chain type |
| Comparative Example 1 | ↑ | 20 | 1 | — | — |
| Comparative Example 2 | ↑ | 20 | 1 | PEG 600 | Polyethylene glycol |
| Comparative Example 3 | ↑ | 20 | 3 | — | — |
| Comparative Example 4 | Sulfonic acid-immobilized colloidal silica | 20 | 1 | DBE-814 | Side-chain type |
| Comparative Example 5 | Unmodified colloidal silica | 20 | 1 | DBE-814 | Side-chain type |
| Comparative Example 6 | Unmodified colloidal silica | 70 | 1 | — | — |

| | Selection ratio improver (hydrophilic group-modified silicone oil) | | | | Polishing speed (Å/min) | | Polishing speed ratio |
| --- | --- | --- | --- | --- | --- | --- | --- |
| | Hydrophilic group | Molecular weight | Content (g/L) | pH | TEOS | SiN | SiN/TEOS |
| Example 1 | Ethylene oxide 70 mass % | 600 | 0.1 | 1.5 | 18 | 568 | 31.56 |
| Example 2 | Ethylene oxide 70 mass % | 600 | 0.15 | 1.5 | 15 | 567 | 37.80 |
| Example 3 | Ethylene oxide 80 mass % | 1,000 | 0.1 | 1.5 | 33 | 569 | 17.24 |
| Example 4 | Ethylene oxide 80 mass % | 1,000 | 0.15 | 1.5 | 32 | 568 | 17.75 |
| Example 5 | Ethylene oxide 40 mass % | 20,000 | 0.1 | 1.5 | 33 | 567 | 17.18 |
| Example 6 | Ethylene oxide 9 mass % | 8,000 | 0.15 | 1.5 | 45 | 560 | 12.44 |
| Example 7 | Ethylene oxide 12 mass % | 10,000 | 0.15 | 1.5 | 34 | 537 | 15.79 |
| Example 8 | Ethylene oxide 12 mass % | 10,000 | 0.15 | 1.5 | 28 | 540 | 17.29 |
| Example 9 | Ethylene oxide 17 mass % | 12,000 | 0.15 | 1.5 | 48 | 535 | 11.15 |
| Example 10 | Ethylene oxide 70 mass % | 600 | 0.15 | 1.5 | 48 | 567 | 11.81 |
| Example 11 | Ethylene oxide 17 mass % | 12,000 | 0.15 | 2.5 | 10 | 465 | 46.50 |
| Comparative Example 1 | — | — | — | 1.5 | 60 | 568 | 9.47 |

TABLE 1-continued

| | | | | | | | |
|---|---|---|---|---|---|---|---|
| Comparative Example 2 | Polyethylene oxide | 600 | 0.15 | 1.5 | 61 | 567 | 9.30 |
| Comparative Example 3 | — | — | — | 1.5 | 74 | 597 | 8.07 |
| Comparative Example 4 | Ethylene oxide 80 mass % | 1,000 | 0.15 | 7 | 11 | 52 | 4.7 |
| Comparative Example 5 | Ethylene oxide 80 mass % | 1,000 | 0.15 | 1.5 | 57 | 76 | 1.3 |
| Comparative Example 6 | — | — | — | 10 | 55 | 30 | 0.55 |

As it is obvious from Table 1 described above, it was found that the polishing compositions of Examples were excellent in an effect of improving a ratio of a polishing speed of an (a) material to a polishing speed of a (b) material, compared to the polishing compositions of Comparative Examples.

Note that, this application is based on Japanese Patent Application No. 2018-055682 filed on Mar. 23, 2018, and the disclosure of which is incorporated by reference in its entirety.

The invention claimed is:

1. A polishing method, comprising:
a step of polishing an object to be polished that contains an (a) material having silicon-nitrogen bonding and a (b) material having a silicon oxide generated by using TEOS as a precursor,
by using a polishing composition comprising:
organic-immobilized silica;
a dispersing medium;
a selection ratio improver that improves a ratio of a polishing speed of the (a) material to a polishing speed of the (b) material; and
an acid,
wherein the selection ratio improver is an organopolysiloxane having a hydrophilic group.

2. A manufacturing method of a semiconductor substrate, the manufacturing method comprising:
a step of polishing a semiconductor substrate that contains an (a) material having silicon-nitrogen bonding and a (b) material having a silicon oxide generated by using TEOS as a precursor, by the polishing method according to claim 1.

3. The method according to claim 1,
wherein the selection ratio improver is side-chain type polyoxyalkylene-modified silicone oil.

4. The method according to claim 1,
wherein the acid is at least one selected from the group consisting of hydrochloric acid, boric acid, carbonic acid, hypophosphorous acid, phosphorus acid, phosphoric acid, citric acid, formic acid, acetic acid, propionic acid, benzoic acid, hydroxyacetic acid, salicylic acid, glyceric acid, oxalic acid, malonic acid, succinic acid, maleic acid, phthalic acid, malic acid, tartaric acid, hydroxyisobutyric acid, lactic acid, methane sulfonic acid, ethane sulfonic acid, and isethionic acid.

5. The method according to claim 1,
wherein a molecular weight of the selection ratio improver is greater than or equal to 200 and less than or equal to 100,000.

6. The method according to claim 1,
wherein the organic acid-immobilized silica is sulfonic acid-immobilized silica.

7. The method according to claim 1,
wherein the pH of the polishing composition is less than or equal to 4.

8. A method for improving a selection ratio of a polishing speed of an (a) material having silicon-nitrogen bonding to a polishing speed of a (b) material having a silicon oxide generated by using a TEOS precursor, the method comprising:
a step of polishing an object to be polished that contains the (a) material and the (b) material comprising:
a step of polishing an object to be polished that contains the (a) material having silicon-nitrogen bonding and the (b) material having a silicon oxide generated by using TEOS as a precursor by using a polishing composition,
wherein the polishing composition contains:
organic acid-immobilized silica;
a dispersing medium;
a selection ratio improver that improves a ratio of a polishing speed of the (a) material to a polishing speed of the (b) material; and
an acid,
wherein the selection ratio improver is an organopolysiloxane having a hydrophilic group.

9. The method according to claim 8,
wherein the selection ratio improver is side-chain type polyoxyalkylene-modified silicone oil.

10. The method according to claim 8,
wherein the acid is at least one selected from the group consisting of hydrochloric acid, boric acid, carbonic acid, hypophosphorous acid, phosphorus acid, phosphoric acid, citric acid, formic acid, acetic acid, propionic acid, benzoic acid, hydroxyacetic acid, salicylic acid, glyceric acid, oxalic acid, malonic acid, succinic acid, maleic acid, phthalic acid, malic acid, tartaric acid, hydroxyisobutyric acid, lactic acid, methane sulfonic acid, ethane sulfonic acid, and isethionic acid.

11. The method according to claim 8,
wherein a molecular weight of the selection ratio improver is greater than or equal to 200 and less than or equal to 100,000.

12. The method according to claim 8,
wherein the organic acid-immobilized silica is sulfonic acid-immobilized silica.

13. The method according to claim 8,
wherein the pH of the polishing composition is less than or equal to 4.

* * * * *